United States Patent [19]
Nelson et al.

[11] Patent Number: 5,192,920
[45] Date of Patent: Mar. 9, 1993

[54] HIGH-SENSITIVITY, LOW-NOISE TRANSISTOR AMPLIFIER

[75] Inventors: Edward T. Nelson, Pittsford; Eric G. Stevens; David M. Boisvert, both of Rochester, all of N.Y.

[73] Assignee: Eastman Kodak Company, Rochester, N.Y.

[21] Appl. No.: 854,046

[22] Filed: Mar. 18, 1992

[51] Int. Cl.$^5$ .................. H03F 1/08; H03K 23/46
[52] U.S. Cl. ................. 330/277; 330/156; 330/292; 330/307; 377/59
[58] Field of Search ............. 330/156, 277, 292, 307; 377/59, 60

[56] References Cited

U.S. PATENT DOCUMENTS 4,646,002 2/1987 Tuszyski ............... 330/156 X

Primary Examiner—James B. Mullins
Attorney, Agent, or Firm—Stephen C. Kaufman

[57] ABSTRACT

A high-gain, low-noise transistor amplifier comprises an input, an output, and first and second field effect transistors each having a gate, a drain, and a source and being formed in a common semiconductor substrate. The second transistor is a depletion mode transistor if it is of the same conductivity type as the first but is an enhancement mode transistor if it is of opposite conductivity type with respect to the first. In an amplifier configuration, the input is coupled to the gate of the first transistor, the source of the first transistor is coupled to the gate of the second transistor, the source of the second transistor is coupled to the output, and there is a direct-coupled feedback path from the source of the second transistor to the drain of the first transistor. At least the first transistor is formed in an isolated well of conductivity opposite to that of the substrate in the semiconductor substrate and its source is coupled directly to that well.

17 Claims, 2 Drawing Sheets

HIGH-SENSITIVITY, LOW-NOISE TRANSISTOR AMPLIFIER

FIELD OF THE INVENTION

This invention relates generally to high-sensitivity, low-noise transistor amplifiers and, more particularly, to transistor amplifiers of the type used for CCD (Charge Coupled Device) charge detection.

BACKGROUND OF THE INVENTION

A well known and widely used configuration for CCD charge detection is called a Floating-Diffusion Amplifier (FDA). In this configuration, the signal charge from the CCD is dumped into a reverse biased, floating diffusion node that is periodically reset to a fixed potential. The presence of this signal charge changes the voltage across the diffusion node by a relation inversely proportional to the effective capacitance of the floating diffusion node (i.e., the input capacitance of the amplifier). The noise introduced by a non-ideal reset process is related to the square root of that same capacitance. The signal-to-noise performance of the detector is thus improved if the input capacitance of the amplifier can be reduced. In the past, device processing factors have limited the amount by which such input capacitance can be reduced. For this reason, such factors have also limited the amount by which signal to noise performance can be improved.

SUMMARY OF THE INVENTION

The invention is directed to a transistor amplifier whose reduced input capacitance makes it particularly suitable for use in low-noise CCD charge-detection.

In its broader aspects, the invention is directed to a high-gain, low-noise, two stage amplifier comprising an input, an output, and first and second source follower field effect transistors each having a gate, a drain, and a source. Both transistors are formed in a common semiconductor substrate. The second transistor is a depletion mode (i.e., buried channel) transistor if it is of the same conductivity type as the first but is an enhancement mode (i.e., surface channel) transistor if it is of opposite conductivity type from the first. In an amplifier configuration according to the invention, the input is coupled to the gate of the first transistor, the source of the first transistor is coupled to the gate of the second transistor, the source of the second transistor is coupled to the output, and there is a direct-coupled feedback path from the source of the second transistor to the drain of the first transistor. Such a configuration provides a significant reduction in the input capacitance of the two stage amplifier and, hence, a significant improvement in signal-to-noise performance.

One important embodiment of the invention is a high-gain, low-noise, two stage amplifier comprising an input, an output, and first and second depletion mode source follower field effect transistors of the same conductivity type each having a gate, a drain, and a source and being formed on a common semiconductor substrate. In this embodiment of the invention, the second transistor is a depletion mode transistor, the input is coupled to the gate of the first transistor, the source of the first transistor is coupled to the gate of the second transistor, the source of the second transistor is coupled to the output, and there is a direct-coupled feedback path from the source of the second transistor to the drain of the first transistor. In order to reduce input capacitance still further, both transistors are formed in isolated wells in the substrate of opposite conductivity type from the substrate and have the source of each transistor coupled directly to its own well.

Another important embodiment of the invention is a high-gain, low-noise, two stage amplifier comprising an input, an output, and first and second enhancement mode source follower field effect transistors of opposite conductivity types each having a gate, a drain, and a source and being formed in a common semiconductor substrate. In this embodiment of the invention, the second transistor is an enhancement mode transistor, the input is coupled to the gate of the first transistor, the source of the first transistor is coupled to the gate of the second transistor, the source of the second transistor is coupled to the output, and there is a direct-coupled feedback path from the source of the second transistor to the drain of the first transistor. In order to reduce input capacitance still further, the first transistor is formed in an isolated well in the substrate of opposite conductivity type from the substrate and has its source coupled directly to its own well.

The invention will be better understood from the following detailed description of the prior art and two specific embodiments, taken in the light of the accompanying drawing and the appended claims.

DETAILED DESCRIPTION

Figure 1:
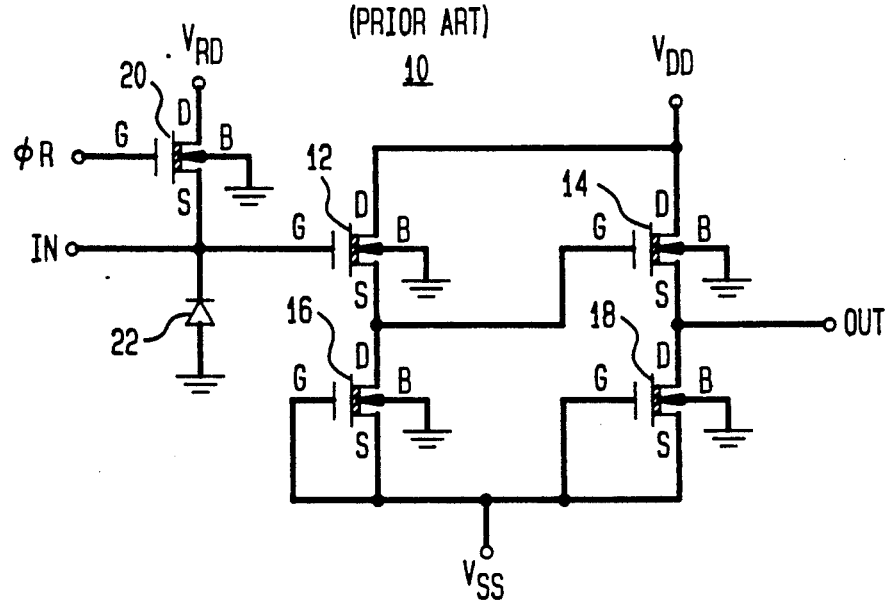
FIG. 1 is a schematic diagram of a floating-diffusion amplifier of a type commonly found in the prior art.

FIG. 1 shows a floating-diffusion amplifier 10 whose principal components are a first depletion mode n-channel field effect transistor 12 and a second depletion mode n-channel field effect transistor 14. Depletion mode transistors are also known as buried channel transistors and are normally in the conducting or on state. Each of transistors 12 and 14 includes connections, as illustrated, to a gate G, a drain D, a source S, and the transistor body (the substrate or the well, as applicable) B. The direction of the arrow associated with each body B indicates, in accordance with convention, that both transistors 12 and 14 are n-channel devices. For p-channel devices, the arrow would point in the opposite direction. As shown, the body of each of transistors 12 and 14 is connected to a common ground.

In amplifier 10, transistor 12 is connected as a source follower input stage and transistor 14 is connected as a source follower output stage. Specifically, an input terminal IN of amplifier 10 is connected to the gate of transistor 12, the source of transistor 12 is connected to the gate of transistor 14, and the source of transistor 14 is connected to an output terminal OUT of amplifier 10. The drains of both transistors 12 and 14 are connected to a positive voltage source $V_{DD}$, while the sources of both transistors 12 and 14 are connected through respective constant current (i.e., high impedance) sources to a voltage source $V_{SS}$ which is negative with respect to source $V_{DD}$.

As illustrated, the first constant current source in amplifier 10 may, by way of example, comprise a depletion mode n-channel field effect transistor 16 having respective gate, drain, source, and body connections and the second constant current source may, by way of example, comprise a depletion mode n-channel field effect transistor 18 having respective gate, drain, source, and body connections. The drain of transistor 16 is connected to the source of transistor 12, while both the gate and the source of transistor 16 are connected to voltage source $V_{SS}$. Similarly, the drain of transistor 18 is connected to the source of transistor 14, while both the gate and the source of transistor 18 are connected to voltage source $V_{SS}$. As illustrated, the body of each of transistors 16 and 18 is connected to the same common ground as those of transistors 12 and 14.

A CCD charge packet is supplied to amplifier 10 through input terminal IN and controlled by another depletion mode n-channel field effect transistor 20 and a diode 22. Like the other transistors in amplifier 10, transistor 20 has gate, source, drain, and body connections. As shown, the source of transistor 20 is coupled to input terminal IN and the drain of transistor 20 is coupled to a positive voltage source $V_{RD}$. A control signal OR is supplied to the gate of transistor 20 to reset input terminal IN to $V_{RD}$. The cathode of diode 22 is connected to the gate of transistor 12, while the anode is connected to ground. Because transistor 20 is normally conducting, diode 22 is normally reverse biased by voltage source $V_{RD}$. Control signal OR consists of a train of pulses each of which selectively biases transistor 20 off. This allows input terminal IN to assume a potential determined by the charge placed thereon by a CCD (not shown).

The presence of a CCD charge at the gate of transistor 12 changes the voltage across the input of the source follower formed by transistor 12 by the equation $$V_s = qN_s/C_{fd},$$

where $N_s$ is the number of charge carriers, $C_{fd}$ is the effective capacitance of the floating diffusion node, and q is the charge of an electron. The noise introduced by a non-ideal reset process is given by the equation $$<N_e> = (kTC_{fd})^{\frac{1}{2}}/q.$$

Therefore, by reducing the capacitance $C_{fd}$, the signal-to-noise performance ($N_s/<N_e>$) of the detector may be improved. It should be noted that, although this so-called kTC noise may be removed by a technique known as correlated double sampling, the actual signal-to-noise ratio includes several other components as well. The same conclusion holds, however, that the signal-to-noise ratio is improved by reducing $C_{fd}$. In order to make amplifier 10 more suitable for use for low-noise CCD charge detection there is, therefore, a need to reduce the input capacitance of amplifier 10 more than previously known techniques readily permit.

The input capacitance of the first source follower stage (transistor 12) of amplifier 10 is given by the equation $$Cin_{10} = (1 - Av1)Cgs_{12} + Cgd_{12} + Cgb_{12}.$$

where Av1 is the small-signal voltage gain of the first stage (transistor 12) and $Cgs_{12}$, $Cgd_{12}$, and $Cgb_{12}$ are the respective gate-to-source, gate-to-drain, and gate-to-body capacitances of transistor 12. From this expression, it can be seen that to reduce $Cin_{10}$, it is desirable to have Av1 close to unity and to have small values of $Cgs_{12}$, $Cgd_{12}$, and $Cgb_{12}$. $Cgs_{12}$, $Cgd_{12}$, and $Cgb_{12}$ can be minimized (for a particular process) by reducing the physical size of transistor 12. Av1, however, is limited by processing to values of from about 0.8 to 0.9 by the so-called body effect of the transistor. The expression for the gain Av1 can be shown to be given by the equation $$Av1 = [1 + (gds12 + gds16 + gmb12)/gm12]^{-1},$$

where gds12 and gds16 are the drain-to-source output conductances of transistors 12 and 14 and gm12 and gmb12 are the respective top-gate and back-gate transconductances of transistor 12, respectively. The ratio of gmb12 to gm12 is known as the body effect parameter X.

Figure 2:
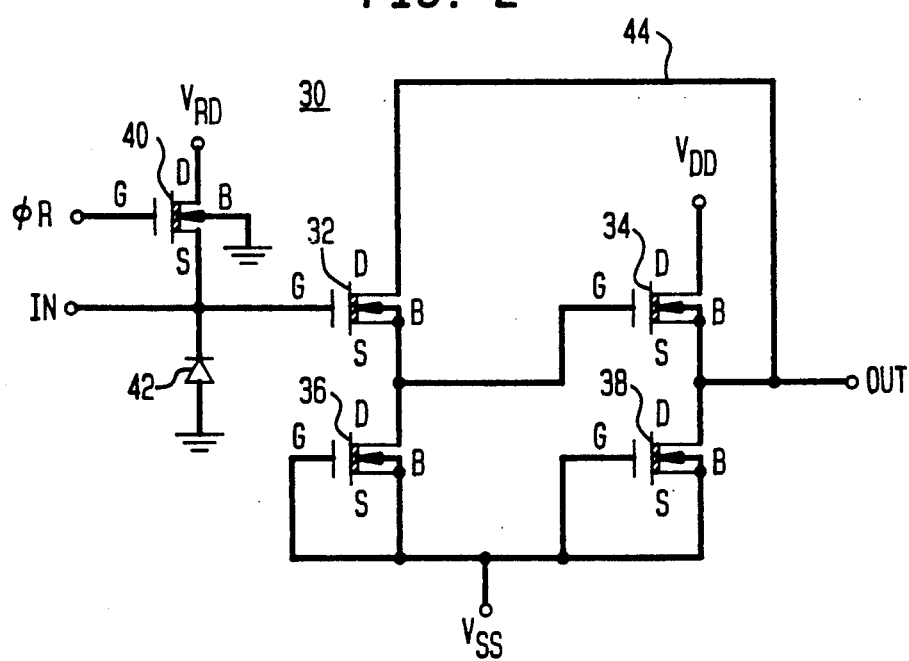
FIG. 2 is a schematic diagram of one two stage transistor amplifier embodying the invention.
Figure 4:
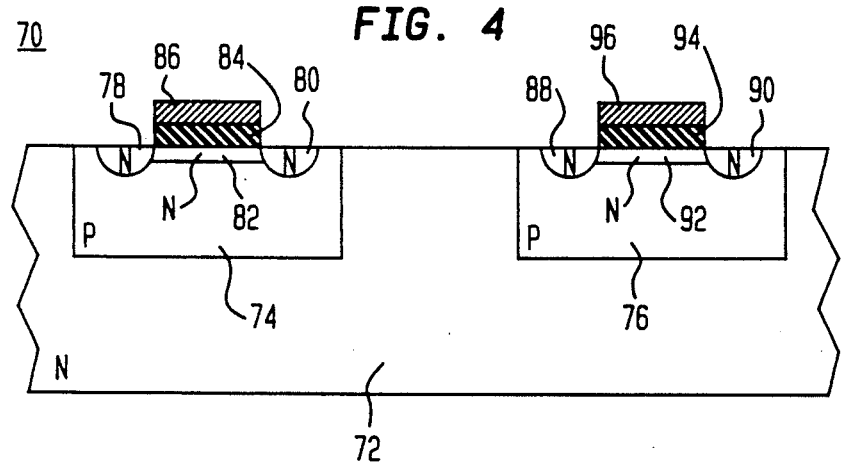
FIG. 4 is a general illustration of a type of semiconductor structure used in connection with the embodiment of the invention shown in FIG. 2.

FIG. 2 illustrates an amplifier 30 which embodies various aspects of the invention. Amplifier 30 is like amplifier 10 in that its principal components are a first depletion mode n-channel field effect transistor 32 and a second depletion mode n-channel field effect transistor 34. Transistors 32 and 34 are both formed, typically, in a common semiconductor substrate, which is shown in FIG. 4. Each of transistors 32 and 34 includes connections, as illustrated, to a gate G, a drain D, a source S, and the transistor body (the respective well, in this instance) B. The direction of the arrow associated with each body B indicates, in accordance with convention, that both transistors 32 and 34 are n-channel devices. One aspect of difference between amplifiers 10 and 30, however, is that in amplifier 30 both transistors 32 and 34 are formed in isolated p-wells in the common semiconductor substrate and the source node of each is tied to the respective p-well.

In amplifier 30, transistor 32 is connected as a source follower input stage and transistor 34 is connected as a source follower output stage. Specifically, an input terminal IN of amplifier 30 is connected to the gate of transistor 32, the source of transistor 32 is connected to the gate of transistor 34, and the source of transistor 34 is connected to an output terminal OUT of amplifier 30. The drain of transistor 34 is connected to a positive voltage source $V_{DD}$, while the sources of both transistors 32 and 34 are connected through respective constant current (i.e., high impedance) sources to a voltage source $V_{SS}$ which is negative with respect to source $V_{DD}$.

As illustrated, the first constant current source in amplifier 30 may, by way of example, comprise a depletion mode n-channel field effect transistor 36 having respective gate, drain, source, and body connections. The second constant current source may, also by way of example, comprise a depletion mode n-channel field effect transistor 38 having respective gate, drain, source, and body connections. The drain of transistor 36 is connected to the source of transistor 32, while both the gate and the source of transistor 36 are connected to voltage source $V_{SS}$. Similarly, the drain of transistor 38 is connected to the source of transistor 34, while both the gate and the source of transistor 38 are connected to voltage source $V_{SS}$. Both transistors 36 and 38 may be formed on the same semiconductor substrate (not shown) as transistors 32 and 34. Both transistors 36 and 38 are formed in isolated p-wells and the source node of each is tied to the respective p-well. In accordance with one important aspect of the invention, a direct-coupled feedback path 44 is provided between the source of transistor 34 and the drain of transistor 32.

A CCD charge packet is supplied to amplifier 30 through input terminal IN and controlled by another depletion mode n-channel field effect transistor 40 and a diode 42. Like the other transistors in amplifier 30, transistor 40 has gate, source, drain, and body connections. As shown, the source of transistor 40 is coupled to input terminal IN and the drain of transistor 40 is coupled to a positive voltage source $V_{RD}$. A control signal OR is supplied to the gate of transistor 40 to reset input terminal IN to $V_{RD}$. The cathode of diode 42 is connected to the gate of transistor 32, while the anode is connected to ground. Because transistor 40 is normally conducting, diode 42 is normally reverse biased by voltage source $V_{RD}$. Control signal OR consists of a train of pulses each of which shuts transistor 20 off. This allows input terminal IN to assume a potential determined by the charge placed thereon by a CCD (not shown).

In amplifier 30, the body effect parameter X is eliminated from the gain expression as a result of transistors 32 and 34 having been formed in isolated p-wells and by tying their source nodes to those p-wells. This eliminates the small-signal voltage variation from body to source, vbs, and improves the amplifier's linearity (since X is inversely proportional to the square root of the source to body voltage vbs). Also, gds1 is effectively reduced by the small-signal voltage gain of the second stage source follower (transistor 34), Av2. The gain of the first stage (transistor 32) of this new configuration can be shown to be given by the equation $$Av1 = \{1 + [gds36 + (1 - Av2)gds32]/gm1\}^{-1}$$

and the gain of the second stage (transistor 34) by the equation $$Av2 = [1 + (gds34 + gds38/gm34]^{-1}.$$

Therefore, feeding back the output of the second stage (transistor 34) to the drain of the first stage (transistor 32) through feedback path 44 further improves the gain of the first stage (transistor 32). Even more importantly, though, the feedback effectively reduces the gate-to-drain capacitance of the first stage (transistor 32). Additionally, since the body of transistor 32 is tied to its source, (i.e., vbs=0), vgb is equal to vgs. Hence, the gate-to-body capacitance $Cgb_{32}$ is reduced in the same manner as $Cgs_{32}$. In can be shown that the input capacitance for this configuration is given by the equation $$Cin_{30} = (1 - Av1)Cgs_{32} + (1 - Av1Av2)Cgd_{32} + (1 - Av1)Cgd_{32}.$$

Typical values for Av1 and Av2 of this new configuration can be as high as 0.97 to 0.99. Therefore, the amplifier 30 configuration has a lower input capacitance and, hence, a better signal to noise ratio than does such prior art as amplifier 10.

To ensure linearity, transistor 32 is kept in its saturation region of operation as defined by Vgd<Vt, where Vgd is its gate-to-drain voltage and Vt is its threshold voltage. In amplifier 30, this is done by using a depletion mode (i.e., buried channel) transistor as the second stage. This results in the outputs of the two stages being higher than their input voltage levels.

Figure 3:
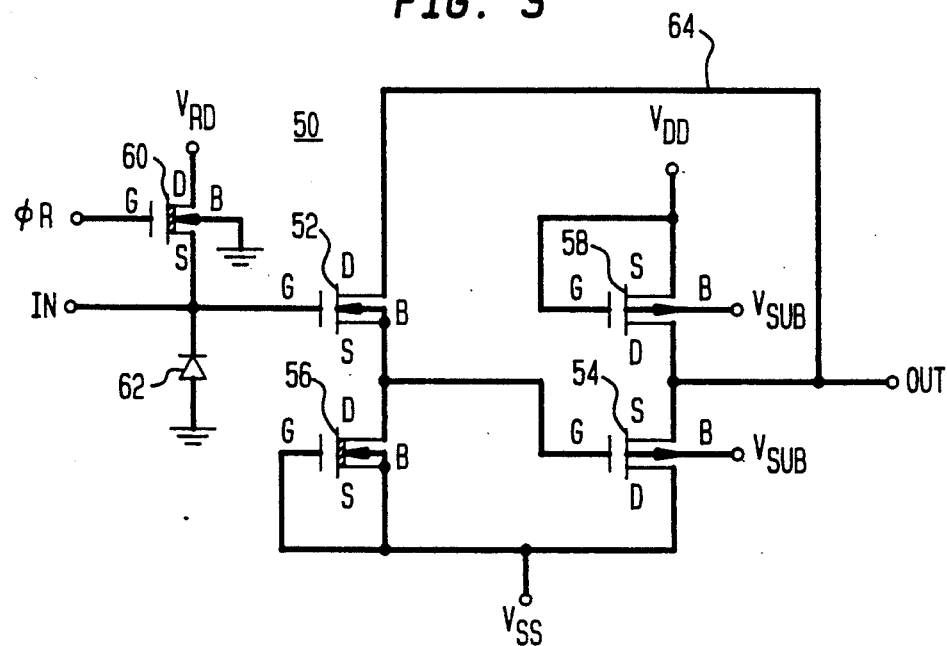
FIG. 3 is a schematic diagram of another two stage transistor amplifier embodying the invention.
Figure 5:
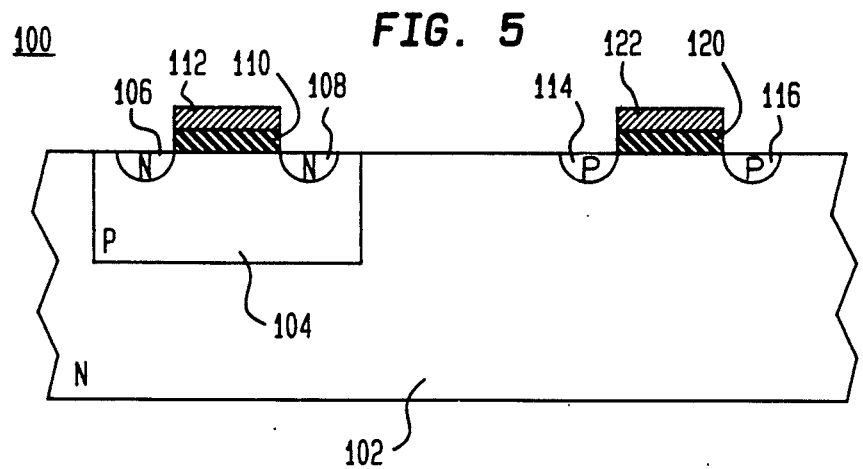
FIG. 5 is a general illustration of a type of semiconductor structure used in connection with the embodiment of the invention shown in FIG. 3.

FIG. 3 illustrates an amplifier 50 which embodies various aspects of the invention and is an alternative to amplifier 30. In amplifier 50, the first stage is an enhancement mode (i.e., surface channel) field effect transistor 52 and the second stage is an opposite conductivity type enhancement mode (i.e., surface channel) field effect transistor 54. More specifically, the first stage is an enhancement mode n-channel field effect transistor 52, while the second stage is an enhancement mode p-channel field effect transistor 54. Each of transistors 52 and 54 includes connections, as illustrated, to a gate G, a drain D, a source S, and the transistor body (the substrate for transistor 52 or the well for transistor 54) B. Transistors 52 and 54 are, typically, formed in a common semiconductor substrate which is shown in FIG. 5. The direction of the arrow associated with each body B indicates, in accordance with convention, that transistor 52 is an n-channel device and transistor 54 is a p-channel device. Transistor 52 is formed in an isolated p-well in the substrate. Transistor 54, which is a p-channel device, is formed directly in the common substrate as shown in FIG. 5. The source node of transistor 52 is tied, as schematically illustrated, to that transistor's isolated p-well.

In amplifier 50, transistor 52 is connected as a source follower input stage and transistor 54 is connected as a source follower output stage. Specifically, an input terminal IN of amplifier 50 is connected to the gate of transistor 52, the source of transistor 52 is connected to the gate of transistor 54, and the source of transistor 54 is connected to an output terminal OUT of amplifier 50. The source of transistor 54 is connected through a second constant current (i.e., high impedance) source to a positive voltage source $V_{DD}$, while the drain of transistor 54 is connected to a voltage source $V_{SS}$ which is either less positive or negative with respect to source $V_{DD}$. The source of transistor 52 is connected through a first constant current source to voltage source $V_{SS}$. The body of transistor 54 is connected to the voltage $V_{SUB}$ of the common substrate of the entire amplifier.

As illustrated, the first constant current source in amplifier 50 may, by way of example, comprise a depletion mode n-channel field effect transistor 56 having respective gate, drain, source, and body connections. The second constant current source may, also by way of example, comprise a depletion mode p-channel field effect transistor 58 having respective gate, drain, source, and body connections. The drain of transistor 56 is connected to the source of transistor 52, while both the gate and the source of transistor 56 are connected to voltage source $V_{SS}$.

The drain of transistor 58 is connected to the source of transistor 54, while both the source and the gate of transistor 58 are connected to voltage source $V_{DD}$. The body of transistor 58 is connected to the voltage $V_{SUB}$ of the common substrate of the entire amplifier. In accordance with an important aspect of the invention, a direct-coupled feedback path 64 is provided from the source of transistor 54 to the drain of transistor 52.

A CCD charge packet is supplied to amplifier 50 through input terminal IN and controlled by another depletion mode n-channel field effect transistor 60 and a diode 62. Like the other transistors in amplifier 50, transistor 60 has gate, source, drain, and body connections. As shown, the source of transistor 60 is coupled to input terminal IN and the drain of transistor 60 is coupled to a positive voltage source $V_{RD}$. A control signal OR is supplied to the gate of transistor 60 to reset input terminal IN to $V_{RD}$. The cathode of diode 62 is connected to the gate of transistor 52, while the anode is connected to ground. Because transistor 60 is normally conducting, diode 62 is normally reverse biased by voltage source $V_{RD}$. Control signal OR consists of a train of pulses each of which biases transistor 60 off. This allows input terminal IN to assume a potential determined by the charge placed thereon by a CCD (not shown).

Amplifier 50 in FIG. 3 reduces effective input capacitance and affords an improved signal to noise ratio in very much the same manner as amplifier 30 in FIG. 2. In a p-well process, however, it is not possible to tie the body of transistor 54 to its source. As a result, amplifier 50 has a somewhat lower second stage gain and a somewhat higher Cin than amplifier 30.

FIG. 4 shows a portion of a semiconductor structure 70 in which amplifier 30 of FIG. 2 may be fabricated. Structure 70 comprises an n-type conductivity semiconductor substrate 72 in which two n-channel depletion mode (i.e., buried channel) transistors are shown. Included in substrate 72 are two p-wells 74 and 76. For each transistor, the respective p-well is the body. The transistor formed in p-well 74 (comparable to transistor 32 of amplifier 30 in FIG. 2) comprises a drain region 78 of n-type conductivity, a source region 80 of n-type conductivity, a buried channel region 82 of n-type conductivity connecting drain 78 and source 80, a dielectric layer 84 (typically SiO$_2$) extending between drain 78 and source 80 on a surface of substrate 72, and a gate electrode 86 extending between drain 78 and source 80 on a surface of dielectric layer 84. The transistor formed in p-well 76 (comparable to transistor 34 of amplifier 30 in FIG. 2) includes a drain region 88 of n-type conductivity, a source region 90 of n-type conductivity, a buried channel region 92 of n-type conductivity connecting drain 88 and source 90, a dielectric layer 94 extending between drain 88 and source 90 on a surface of substrate 72, and a gate electrode 96 extending between drain 88 and source 90 on a surface of dielectric layer 94.

FIG. 5 shows a portion of a semiconductor structure 100 in which amplifier 50 of FIG. 3 may be fabricated. Structure 100 comprises an n-type conductivity semiconductor substrate 102 which includes one n-channel enhancement mode (i.e., surface channel) transistor and one p-channel enhancement mode (i.e., buried channel) transistor. Included in substrate 72 is a p-well 104, which constitutes the body of the transistor. The transistor formed in p-well 104 (comparable to transistor 52 of amplifier 50 in FIG. 3) includes a drain region 106 of n-type conductivity, a source region 108 of n-type conductivity, a dielectric layer 110 (typically SiO$_2$) extending between drain 106 and source 108 on a surface of substrate 102, and a gate electrode 112 extending between drain 106 and source 108 on a surface of dielectric 110. The remaining transistor (comparable to transistor 54 of amplifier 50 in FIG. 3) is formed directly in substrate 102 and includes a drain region 114 of p-type conductivity, a source region 116 of p-type conductivity, a dielectric layer 120 extending between drain 114 and source 116 on a surface of substrate 102, and a gate electrode 122 extending between drain 114 and source 116 on a surface of dielectric layer 120. For this latter transistor, substrate 102 itself constitutes the body.

It is to be understood that the embodiments of the invention which have been described are illustrative. Transistors of conductivity type opposite to those shown may be employed, for example, if all diode and voltage polarities are reversed from those shown as well. In addition, transistor 32 in FIG. 2 may be an enhancement mode transistor if desired and transistor 52 in FIG. 3 may be a depletion mode transistor if desired. Numerous other arrangements and modifications may also be readily devised by those skilled in the art without departing from the spirit and scope of the invention.

What is claimed is:

1. An amplifier comprising:
   an input, an output, and first and second field effect transistors each having a gate, a drain, and a source and being formed on a common semiconductor substrate;
   the second transistor being of a mode selected from a group consisting of depletion mode and enhancement mode;
   the first and second transistors being of conductivity types selected from a group consisting of the same conductivity types and opposite conductivity types;
   the second transistor being depletion mode with first and second transistors being of the same conductivity types;
   the second transistor being enhancement mode with first and second transistors being of opposite conductivity types;
   means coupling the input to the gate of the first transistor;
   means coupling the source of the first transistor to the gate of the second transistor;
   means coupling the source of the second transistor to the output; and
   a direct-coupled feedback path from the source of the second transistor to the drain of the first transistor.

2. The amplifier of claim 1 in which the first transistor is formed in an isolated well in the substrate, the well being of opposite conductivity type with respect to the substrate, and which further comprises means coupling the source of the first transistor to its own well.

3. The amplifier of claim 1 further comprising means for coupling a voltage source between the sources and drains of both of the transistors.

4. The amplifier of claim 3 further comprising means for coupling a first substantially constant current source to the source of the first transistor and means for coupling a second substantially constant current source to the source of the second transistor.

5. The amplifier of claim 4 in which the first transistor is formed in an isolated well in the substrate, the well being of opposite conductivity type with respect to the substrate, and which further comprises means coupling the source of the first transistor to its own well.

6. An amplifier comprising:
   an input, an output, and first and second field effect transistors of the same conductivity type each having a gate, a drain, and a source and being formed on a common semiconductor substrate, the second transistor being a depletion mode transistor;
   means coupling the input to the gate of the first transistor;
   means coupling the source of the first transistor to the gate of the second transistor;
   means coupling the source of the second transistor to the output; and a direct-coupled feedback path from the source of the second transistor to the drain of the first transistor.

7. The amplifier of claim 6 in which both of the transistors are formed in isolated wells in the substrate, the wells being of opposite conductivity type from the substrate, and which further comprises means coupling the source of each of the transistors to its own well.

8. The amplifier of claim 6 further comprising means for coupling a voltage source between the sources and drains of both of the transistors.

9. The amplifier of claim 8 further comprising means for coupling a first substantially constant current source to the source of the first transistor and means for coupling a second substantially constant current source to the source of the second transistor.

10. The amplifier of claim 9 in which both of the transistors are formed in isolated wells in the substrate, the wells being of opposite conductivity type from the substrate, and which further comprises means coupling the source of each of the transistors to its own well.

11. An amplifier comprising:
an input, an output, and first and second field effect transistors of opposite conductivity types each having a gate, a drain, and a source and being formed on a common semiconductor substrate, the second transistor being an enhancement mode transistor;
means coupling the input to the gate of the first transistor;
means coupling the source of the first transistor to the gate of the second transistor;
means coupling the source of the second transistor to the output; and
a direct-coupled feedback path from the source of the second transistor to the drain of the first transistor.

12. The amplifier of claim 11 in which the first transistor is formed in an isolated well in the substrate, the well being of opposite conductivity type from the substrate, and which further comprises means coupling the source of the first transistor to its own well.

13. The amplifier of claim 11 further comprising means for coupling a voltage source between the sources and drains of both of the transistors.

14. The amplifier of claim 13 further comprising means for coupling a first substantially constant current source to the source of the first transistor and means for coupling a second substantially constant current source to the source of the second transistor.

15. The amplifier of claim 14 in which the first transistor is formed in an isolated well in the substrate, the well being of opposite conductivity type from the substrate, and which further comprises means coupling the source of the first transistor to its own well.

16. An amplifier comprising:
a semiconductor substrate;
first and second separated field effect transistors of the same conductivity type each of which is formed in the substrate and having a drain, a source, and a gate, the second transistor being a depletion mode transistor;
first and second constant current sources formed in the substrate;
the source of the first transistor being coupled to the first constant current source and the gate of the second transistor;
the gate of the first transistor being adapted to serve as an input of the amplifier;
the source of the second transistor being coupled to the second constant current source and to an output of the amplifier; and
a direct-coupled feedback path between the source of the second transistor and the drain of the first transistor.

17. An amplifier comprising:
a semiconductor substrate;
first and second separated field effect transistors of opposite conductivity types each of which is formed in the substrate and having a drain, a source, and a gate, the second transistor being an enhancement mode transistor;
first and second constant current sources formed in the substrate;
the source of the first transistor being coupled to the first constant current source and the gate of the second transistor;
the gate of the first transistor being adapted to serve as an input of the amplifier;
the source of the second transistor being coupled to the second constant current source and to an output of the amplifier; and
a direct-coupled feedback path between the source of the second transistor and the drain of the first transistor.

* * * * *